United States Patent

Inasaka

[11] Patent Number: 5,136,471
[45] Date of Patent: Aug. 4, 1992

[54] LAMINATE WIRING BOARD

[75] Inventor: Jun Inasaka, Tokyo, Japan

[73] Assignee: NEC Corporation, Tokyo, Japan

[21] Appl. No.: 659,548

[22] Filed: Feb. 25, 1991

Related U.S. Application Data

[63] Continuation of Ser. No. 350,240, May 11, 1989, abandoned, which is a continuation of Ser. No. 159,913, Feb. 24, 1988, abandoned.

[30] Foreign Application Priority Data

Feb. 26, 1987 [JP] Japan .................. 62-41545
Sep. 18, 1987 [JP] Japan .................. 62-233816

[51] Int. Cl.$^5$ ........................................ H05K 1/14
[52] U.S. Cl. ........................ 361/414; 361/412; 174/255; 174/260; 174/261
[58] Field of Search ............ 361/412/414; 174/255, 174/260, 261, 52.4

[56] References Cited

U.S. PATENT DOCUMENTS

| | | | |
|---|---|---|---|
| 3,691,429 | 9/1972 | Glaser | 361/414 X |
| 4,074,342 | 2/1978 | Honn et al. | 361/411 |
| 4,450,029 | 5/1984 | Holbert et al. | 174/68.5 X |
| 4,551,746 | 11/1985 | Gilbert et al. | 361/414 |
| 4,598,308 | 7/1986 | James et al. | 361/401 X |
| 4,612,602 | 9/1986 | Weyer et al. | 361/394 |
| 4,628,411 | 12/1986 | Balderes et al. | 361/414 |
| 4,630,172 | 12/1986 | Stenerson | 361/414 X |
| 4,652,977 | 3/1987 | Jones | 361/414 |
| 4,694,123 | 9/1987 | Massey | 361/414 X |
| 4,725,925 | 2/1988 | Tanaka et al. | 174/68.5 X |
| 4,731,701 | 3/1988 | Kuo et al. | 361/414 |

FOREIGN PATENT DOCUMENTS 1529405 6/1968 France .................. 361/414

Primary Examiner—Leo P. Picard
Assistant Examiner—Paramita Ghosh
Attorney, Agent, or Firm—Burns, Doane, Swecker & Mathis

[57] ABSTRACT

In a laminate wiring board having power source layers therein and provided with pins for signal input and output and pins for power supply, the power source layers are exposed at a side end of the wiring board, and pads for power supply are provided on the exposed side end.

19 Claims, 4 Drawing Sheets

LAMINATE WIRING BOARD

This application is a continuation of application Ser. No. 07/350,240, filed May 11, 1989 which is a continuation of application Ser. No. 07/159,913, filed Feb. 24, 1988, both now abandoned.

BACKGROUND OF THE INVENTION

The present invention relates to the feed structure of a laminate wiring board which facilitates dense arrangement of large scale integrated (LSI) chips.

Generally, a laminate wiring board has wiring layers thereinside which are connected to numerous input and output pins which are in turn exposed to the outside at one side of the wiring board. A number of LSI chips are mounted on that side of the circuit board which is opposite to the input and output pins. It has been customary to feed power to such LSI chips from signal input and output pins and power supply pins through the internal wiring layers, as disclosed in U.S. Pat. No. 4,612,602 by way of example.

In the above-described type of feed structure of a laminate wiring board, a part of input and output pins is exclusively assigned to the input and output of signals, and the remaining part of them is exclusively assigned to the supply of power. A drawback with such a feed structure is that the electrodes available for signal input and output and those available for power supply are few and, therefore, cannot cope with an increasing demand for dense arrangement of LSI chips.

SUMMARY OF THE INVENTION

It is, therefore, an object of the present invention to provide a feed structure of a laminate wiring board capable of meeting the demand for dense arrangement of LSI chips.

It is another object of the present invention to provide a feed structure of a laminate wiring board which allows the number of electrodes for signal input and output and that of electrodes for power supply to be increased as desired.

It is another object of the present invention to provide a generally improved feed structure of a laminate circuit board.

In accordance with the present invention, in a laminate wiring board having pins for signal input and output and pins for power supply which are arranged on the back of a multilayer ceramic substrate, the pins for signal input and output being connected to the surface of the substrate by through holes which are formed through the substrate, the pins for power supply being connected to the surface of the substrate by through holes by way of conductive layers which are provided in the substrate, the conductive layers provided in the substrate are sequentially increased or decreased in area to form pads for power supply in a step-like configuration at a side end of the substrate.

Further, in accordance with the present invention, in a laminate wiring board having power source layers therein and provided with pins for signal input and output and pins for power supply, the power source layers are exposed at a side end of the wiring board, and pads for power supply are provided on the exposed side end.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
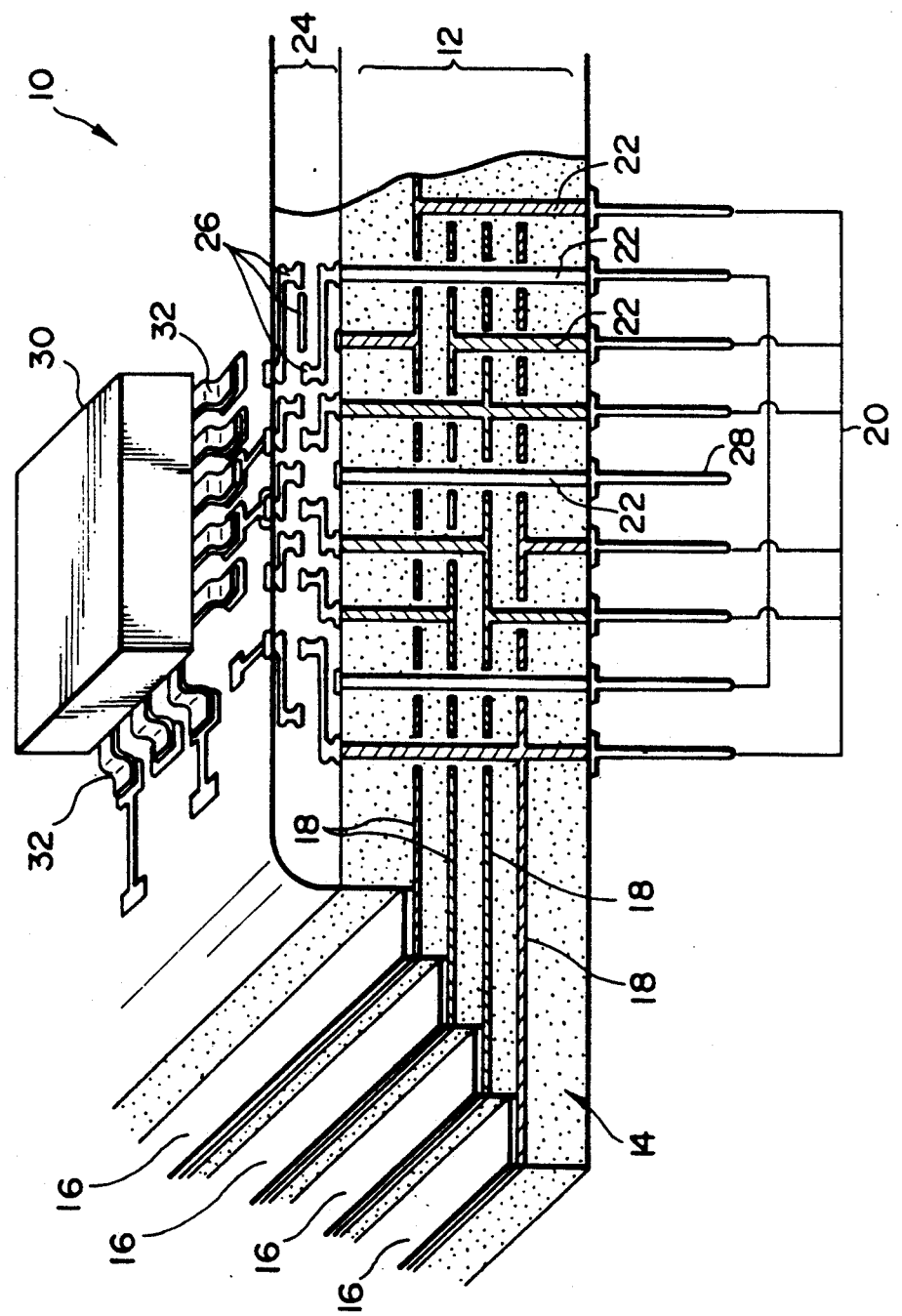
FIG. 1 is a section showing a laminate wiring board embodying the present invention.

Referring to FIG. 1, a laminate wiring board in accordance with the present invention is shown and generally designated by the reference numeral 10. As shown, the wiring board 10 includes a multilayer substrate 12 which is made of ceramic and provided with power source layers 14 therein. Specifically, the substrate 12 is fabricated by laminating a plurality of ceramic sheets each having a conductive layer printed thereon and being different in area from the others. The power source layers 14 are exposed to the outside in a step-like configuration on a side end of the substrate 12, constituting pads 16 for the supply of power. The ceramic sheets may each be about 100 microns thick while the conductive layers may each be about 10 microns thick and implemented with gold, silver-palladium alloy, tungsten, etc. The exposed power supply pads 16 which are connectable to the outside are individually connected to power source wiring layers 18 which are also provided in the substrate 12. Pins 20 adapted for power supply are rigidly mounted on the back of the substrate 12 and made of the same material as the power source wiring layers 18. The pins 20 are individually connected to the power source wiring layers 18 by through holes 22 which are each dimensioned about 200 microns in diameter. The pads 16 on the side end of the substrate 12 and the pins 20 on the back of the substrate 12 are classified on the basis of the kind of power source used and connected to the internal power source of the substrate 12. The power source is further connected to wiring networks 26 which are defined in a multilayer thin wiring layer 24, by way of the through holes 22. Formed on the surface of the substrate 12, the wiring layer 24 includes interlayer insulating members a major component of which is polyimide. The wirings in the wiring networks 26 are about 25 microns wide each.

Pins 28 for signal input and output are also rigidly mounted on the back of the substrate 12 and connected to the wiring networks 26 by the through holes 22. The power source wirings and the signal wirings which are connected by the laminate wiring layer 24 are connected at the surface of the wiring layer 24 to leads 32 of an LSI chip 30 which is rigidly mounted on the wiring layer 24. By configuring the periphery of the substrate 12 in steps on a 1 millimeter basis to expose the power source layer to the outside, it is possible to provide power supply pads 16 corresponding to about 300 pins around the substrate 12 and to reduce the voltage drop in the substrate 12 to about one twentieth. In addition, such a configuration makes those pins heretofore assigned to power supply available for signal input and output.

Figure 2:
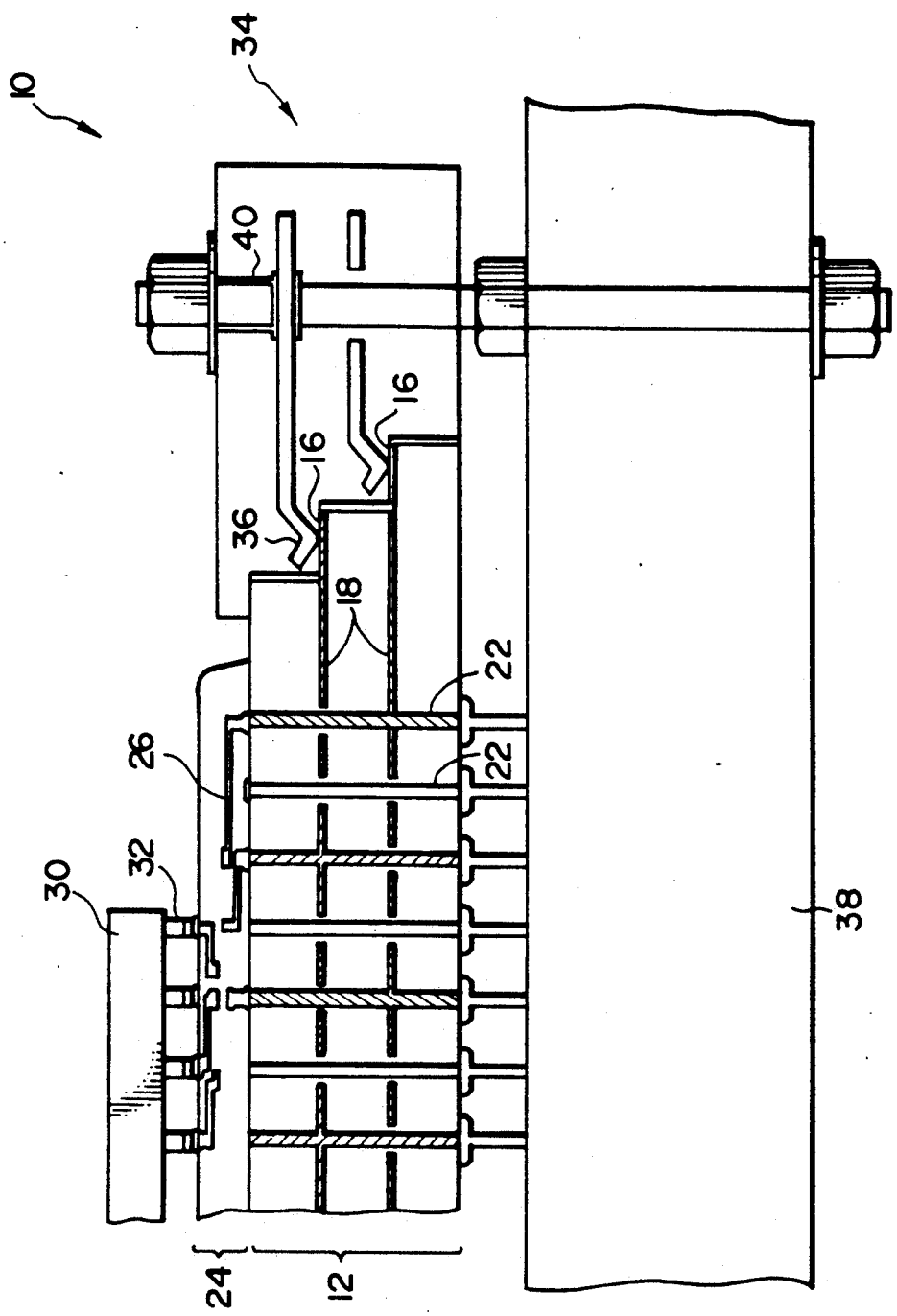
FIG. 2 is an elevation showing connection of the wiring board of FIG. 1 with a printed circuit board.

As shown in FIG. 2, a connector 34 shaped to be connectable with the pads 16 around the multilayer substrate 12 is connected to the substrate 12. The connector 34 serves to fix the substrate 12 in place and to fix a cooling module which is adapted to cool the LSI chip 30 ont the substrate 12. Specifically, the connector 34 includes resilient electrodes 36 which are individually pressed against the pads 16 of the substrate 12. The electrodes 36 are connected to a screw 40 which is used to fasten the substrate 12 to a printed circuit board 38. In this manner, the screw 40 implements the supply of power from the printed circuit board 38 and, therefor, allows relatively large current to be fed. Another advantage attainable with the screw 40 is that it eliminates incomplete electrical contact.

In the above embodiment, the ceramic sheets which constitute the power source wiring layers 18 of the substrate 12 are sequentially reduced in area toward the surface of the substrate 12. Alternatively, the configuration may be such that the area is sequentially reduced toward the back of the substrate 12.

Figure 3:
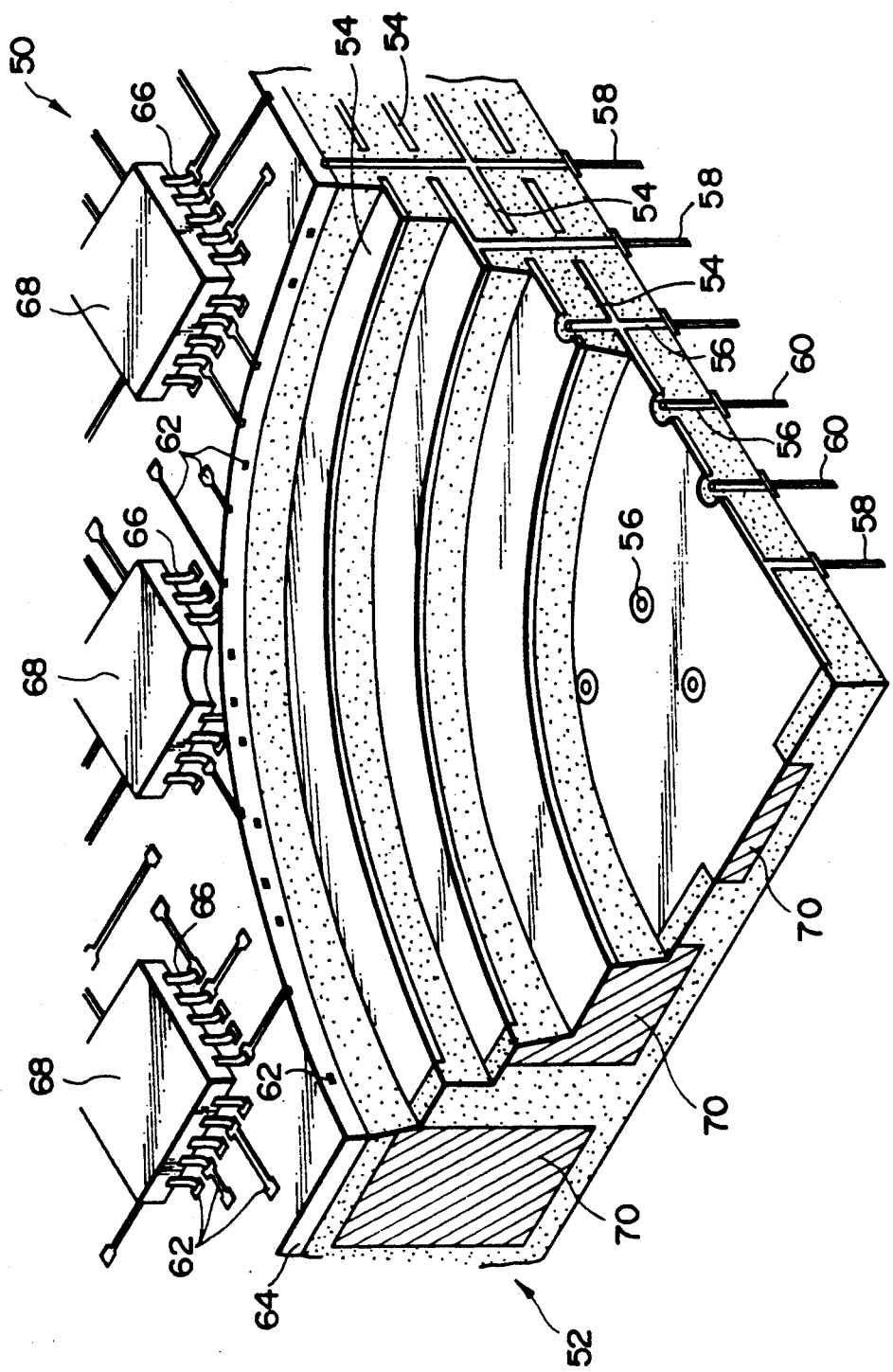
FIG. 3 is a perspective view of another embodiment of the present invention.

Referring to FIG. 3, another embodiment of the present invention is shown. The wiring board, generally 50, includes a multilayer substrate 52 which is made of ceramic. As shown, the substrate 52 includes three power source layers 54 a major component of which is tungsten, signal input and output pins 58 and power supply pins 60 which are individually connected to the power source layers 54 by through holes 56 and mainly made of tungsten, and a thin layer 64 connected by the through holes 56 and provided therein with gold-plated wiring networks 62. LSI chips 68 each having leads 66 to be connected to the wiring network 62 are mounted on the upper surface of the thin layer 64.

Figure 4:
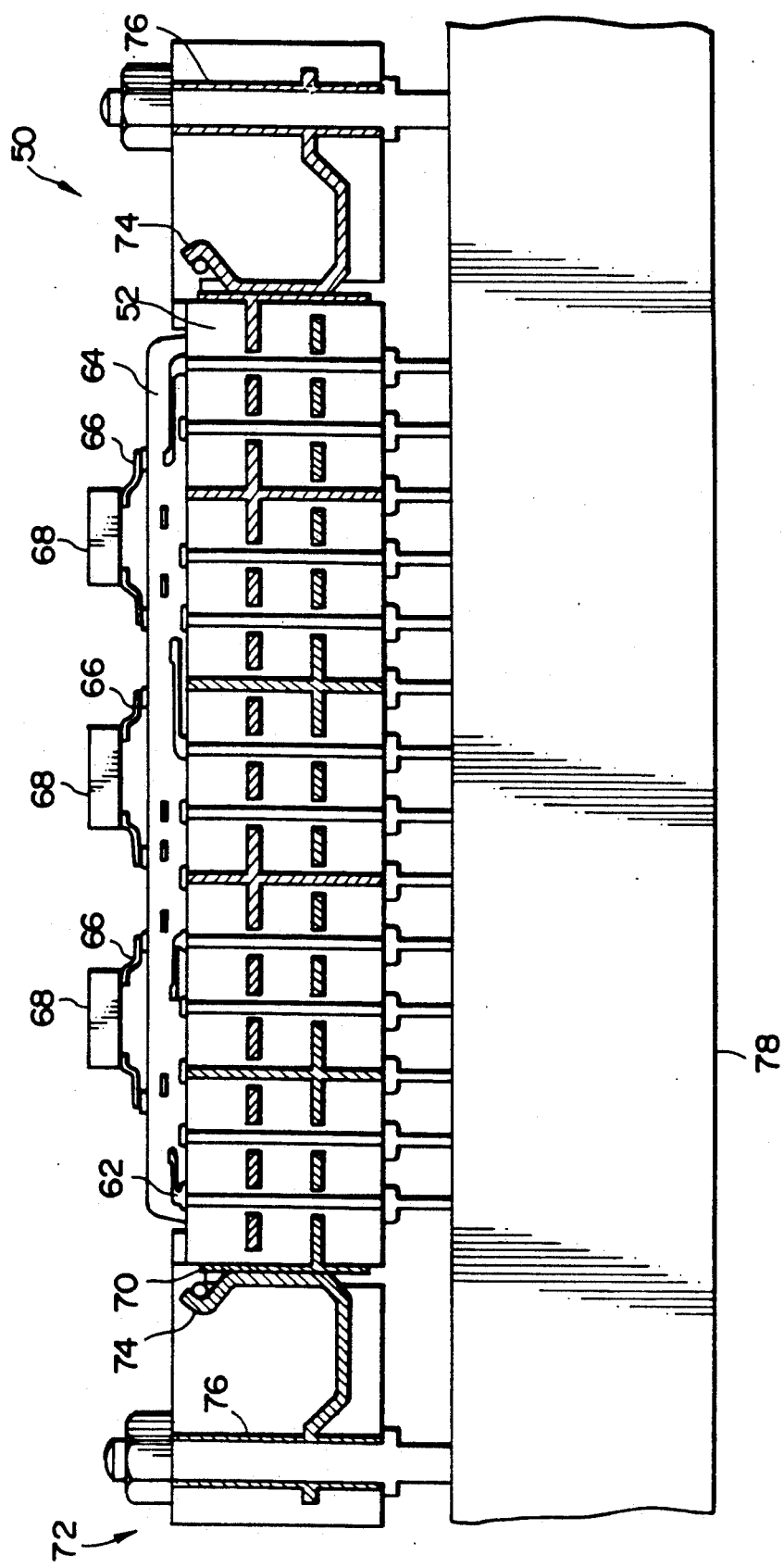
FIG. 4 is an elevation showing connection of the wiring board of FIG. 3 with a printed circuit board.

The power source layers 54 are exposed at a side end of the substrate 52. Interlayer insulating members provided in the thin layer 64 are made of polyimide-based synthetic resin. In this particular embodiment, three power supply pads 70 are defined at the exposed end of the power source layers 54. All the power supply pads 70 may be produced by forming a film on the exposed end of the power source layers 54 by sputtering after the fabrication of the substrate 52, applying photoresist to that end, melting the photoresist by photolithography to form a conductive film which is dimensioned 2 millimeter by 2 millimeter, and plating the conductive film with gold. As shown in FIG. 4, the pads 70 are electrically connected to a printed circuit board 78 through electrodes 74 of connectors 72 and screws 76. The wiring networks 62, like the pads 70, may be formed by providing a film on the conductor by sputtering and applying photolithography thereto. Each wiring of the wiring networks 62 is dimensioned about 25 microns, the through holes 56 are dimensioned about 20 microns in diameter each, and the power source layers 54 are about 100 microns thick each.

With the feed structure of the wiring board 50 in accordance with this embodiment, it is possible to decrease the number of pins 60 assigned to power supply and to increase the number of pins 58 assigned to signal input and output. This allows a greater number of electrodes to be allocated to signal input and output as well as to power supply. Further, since the pads 70 accommodate 100 power supply pins 60, the voltage drop in the substrate which occurs in the event of power supply is reduced to about one-tenth.

While the electrodes for power supply are constituted by the pads 70 and pins 60, those electrodes are selectively used in matching relation to the kind of power source used. The number of power source layers 54 and that of pads 70 are not limited to those shown and described and may alternatively be, for example, five or six.

In summary, it will be seen that a laminate wiring board of the present invention allows a minimum of voltage drop to occur in a multilayer ceramic substrate, and allows the number of power supply pins adapted for power supply to be decreased while allowing the number of signal input and output pins to be increased.

Various modifications will become possible for those skilled in the art after receiving the teachings of the present disclosure without departing from the scope thereof.

What is claimed is:

1. In a laminate wiring board having power source layers therein and provided with signal input and output pins and power supply pins supplying an operational voltage as opposed to a reference or ground voltage, said signal input and output pins and power supply pins electrically connected to a printed circuit board, said power source layers are exposed at a side surface of said wiring board, and power supply pads supplying an operational voltage as opposed to a reference or ground voltage, are provided on said exposed side surface, said power supply pads respectively connected to said power source layers, and said power supply pads electrically connected to said printed circuit board.

2. In a laminate wiring board as set forth in claim 1, wherein each of said power source layers is substantially perpendicular to a corresponding power supply pad.

3. In a laminate wiring board as set forth in claim 1, wherein said side surface is substantially perpendicular to said power source layers.

4. In a laminate wiring board as set forth in claim 3, wherein each of said power source layers is substantially perpendicular to a corresponding power supply pad.

5. In a laminate wiring board as set forth in claim 1, wherein said power source layers are respectively exposed at more than one side surface of said wiring board, and said power supply pads are respectively provided on each said exposed side surface.

6. In a laminate wiring board as set forth in claim 5, wherein each power source layer is substantially perpendicular to a corresponding power supply pad.

7. In a laminate wiring board as set forth in claim 6, wherein each said exposed side surface is substantially perpendicular to a corresponding power source layer.

8. In a laminate wiring board having at least one power source layer therein and provided with at least one signal input pin, at least one signal output pin, and at least one power supply pin supplying an operational voltage as opposed to a reference or ground voltage, the signal input, signal output, and power supply pins electrically connected to a printed circuit board, each said power source layer being exposed at a side surface of said wiring board, and at least one power supply pad supplying an operational voltage as opposed to a reference or ground voltage, being provided on at least one exposed side surface of said wiring board, each said power supply pad respectively connected to a power source layer, and each said power supply pad electrically connected to said printed circuit board.

9. In a laminate wiring board as set forth in claim 8, wherein each said power source layer is substantially perpendicular to a corresponding power supply pad.

10. In a laminate wiring board as set forth in claim 8, wherein each said side surface is substantially perpendicular to a corresponding power source layer.

11. In a laminate wiring board as set forth in claim 10, wherein each said power source layer is substantially perpendicular to a corresponding power supply pad.

12. In a laminate wiring board as set forth in claim 8, wherein said laminate wiring board has a plurality of power source layers therein and is provided with a plurality of signal input and output pins and power supply pin, and has a plurality of power supply pads.

13. In a laminate wiring board as set forth in claim 12, wherein said power supply pads are respectively provided on more than one exposed side surface of said wiring board.

14. In a laminate wiring board as set forth in claim 13, wherein each said power source layer is substantially perpendicular to a corresponding power supply pad.

15. In a laminate wiring board as set forth in claim 13, wherein each said side surface is substantially perpendicular to a corresponding power source layer.

16. In a laminate wiring board as set forth in claim 15, wherein each said power source layer is substantially perpendicular to a corresponding power supply pad.

17. In a laminate wiring board as set forth in claim 12, wherein each said power source layer is substantially perpendicular to a corresponding power supply pad.

18. In a laminate wiring board as set forth in claim 12, wherein each said side surface is substantially perpendicular to a corresponding power source layer.

19. In a laminate wiring board as set forth in claim 18, wherein each said power source layer is substantially perpendicular to a corresponding power supply pad.

* * * * *